United States Patent [19]

Hosono

[11] Patent Number: 4,887,283
[45] Date of Patent: Dec. 12, 1989

[54] X-RAY MASK AND EXPOSURE METHOD EMPLOYING THE SAME

[75] Inventor: Kunihiro Hosono, Itami, Japan

[73] Assignee: Mitsubishi Denki Kabushiki Kaisha, Japan

[21] Appl. No.: 327,249

[22] Filed: Mar. 22, 1989

[30] Foreign Application Priority Data

Sep. 27, 1988 [JP] Japan ................................ 63-243103

[51] Int. Cl.$^4$ ............................................. G21K 5/00
[52] U.S. Cl. ......................................... 378/35; 430/5
[58] Field of Search ........................ 378/34, 35; 430/5

[56] References Cited

FOREIGN PATENT DOCUMENTS 55-15256  3/1980  Japan ...................................... 378/35
62-122216  6/1987  Japan .

Primary Examiner—Craig E. Church
Attorney, Agent, or Firm—Leydig, Voit & Mayer

[57] ABSTRACT

An X-ray mask includes a membrane formed of a material which transmits X-rays, a mask pattern formed on the surface of the membrane, the mask pattern being made of an X-ray absorbing material, and a supporting frame formed of a material which is mechanically deformed by an external signal. The supporting frame supports the membrane. In an exposure method which employs this X-ray mask, the X-ray mask is first disposed above a substrate in alignment therewith. Subsequently, distortion in the mask pattern is corrected by the application of the external signal to the supporting frame of the mask, and the substrate is then irradiated with X-rays through the mask so as to transfer the mask pattern of the mask to the substrate.

21 Claims, 6 Drawing Sheets

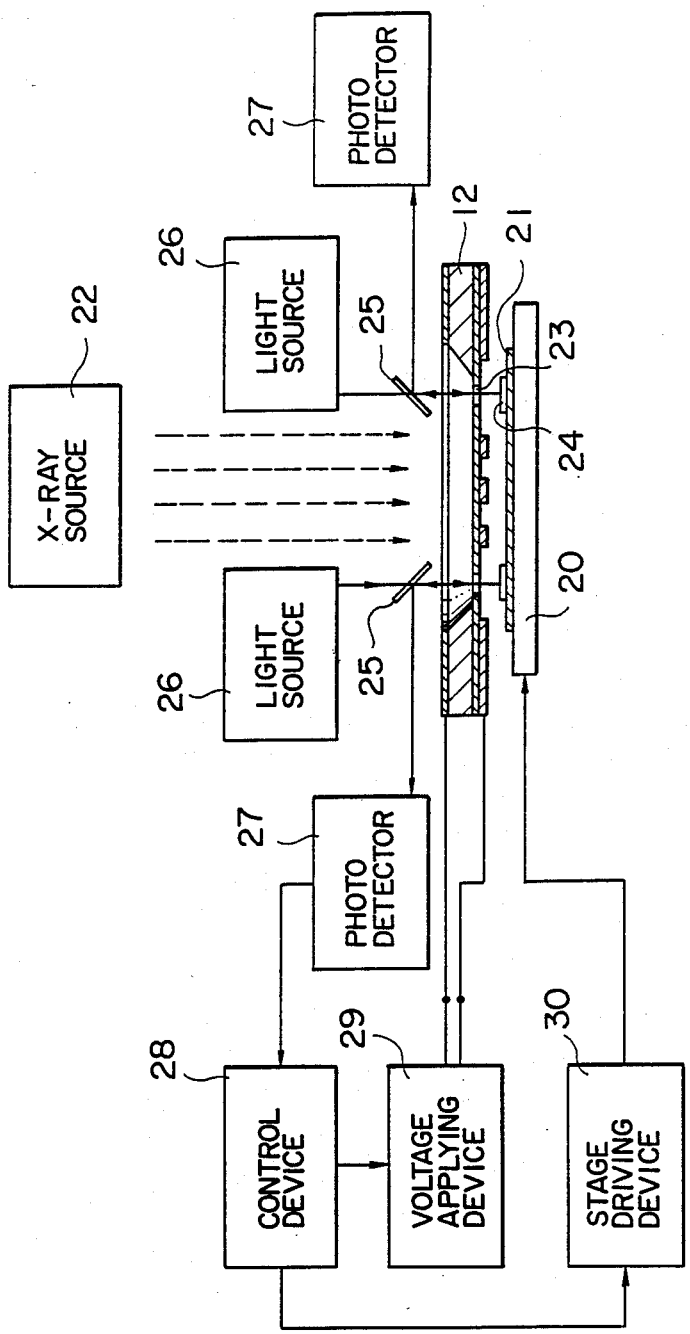

X-RAY MASK AND EXPOSURE METHOD EMPLOYING THE SAME

BACKGROUND OF THE INVENTION

1. Field of the Invention

The present invention relates to an X-ray mask for use in X-ray lithography in which a pattern is transferred to a substrate by the radiation of X-rays, and an exposure method employing the same.

2. Description of the Related Art

Generally, X-ray lithography technology involves a process of transferring very fine patterns of about 0.3 μm or less to a substrate.

FIG. 1 is a plan view of a conventional X-ray mask employed to transfer the minute patterns to a substrate, and FIGS. 2 and 3 are sections taken along the line II—II of FIG. 1, respectively showing a state in which a supporting frame to be described later has not yet been etched and a state in which it has already been etched. An X-ray mask 2 shown in these figures has a membrane 4 made of a material, such as silicon nitride, which is highly transparent to X-rays, a mask pattern 6 made of a material, such as tungsten, which absorbs X-rays, the mask pattern 6 being formed on the upper surface of the membrane 4, a supporting frame 8 of Si formed on the lower surface of the membrane 4 for mechanically supporting the membrane 4, and an etching mask 10 provided on the lower surface of the supporting frame 8 to be used as a mask during etching of the supporting frame 8.

In the thus-arranged conventional X-ray mask structure, the membrane 4 and the mask pattern 6 are sequentially formed as very thin films having a thickness of several μm by vacuum deposition, sputtering, or the CVD method. In consequence, when the central portion of the disk-shaped supporting frame 8 is etched after the membrane 4 and the mask pattern 6 have been formed on the upper surface of the supporting frame 8 and after the etching mask 10 has been formed on the lower surface thereof, as shown in FIG. 2, the thin membrane 4 is deformed due to the reduction in the internal stress in the membrane 4 and in the mask pattern 6. As shown in FIG. 3, the mask pattern 6 formed on the upper surface of the membrane 4 is shifted from its predetermined correct position, thereby causing a distortion of the pattern.

Further, the supporting frame 8, the membrane 4, and the mask pattern 6 may be thermally distorted, respectively, because of changes in an ambient temperature of the location where the X-ray mask 2 is placed, which may also lead to pattern distortion.

FIG. 4 shows a mask pattern 6 in which such a pattern distortion has been generated. In FIG. 4, the outline of the mask pattern 6 as viewed from above is schematically represented by the square, which is divided into 25 pattern portions. The pattern portions $A_1$, $A_2$, $A_3$ shown by the broken line represent those located at their correct positions, whereas the pattern portions $B_1$, $B_2$, $B_3$ ... shown by the solid line are those which have been displaced from their correct positions by pattern distortion. In particular, the hatched areas represent the mask pattern 6, which has been shifted from its correct position by pattern distortion.

If an X-ray mask 2 with the mask pattern 6 which has been displaced from its correct position is employed to transfer the circuit patterns to the substrate, the accuracy with which the circuit patterns are aligned with the substrate reduced to a great extent, and this makes formation of the very fine patterns on the substrate with a high degree of accuracy difficult.

In order to obviate this problem, Japanese Patent Laid-Open No. 62-122216 discloses an X-ray mask in which electrostriction or magnetostriction elements bonded to a supporting frame by an adhesive are deformed so as to correct the distortion in the mask. However, this X-ray mask structure suffers from a problem in that the adhesive is readily removed due to repeated vibrations of these electrostriction or magnetostriction elements. This in turn causes removal of the elements from the supporting frame, which leads to a reduction in the reliability of the mechanical structure of the mask. The X-ray mask also has a disadvantage in that it takes much time and trouble for the elements to be bonded to the supporting frame.

SUMMARY OF THE INVENTION

An object of the present invention is directed to obviating the aforementioned problems of the conventional X-ray mask by providing an X-ray mask which enables a mask pattern shifted from the correct position to be readily returned to its correct position, which is mechanically reliable, and which can be easily manufactured, as well as an exposure method employing such an X-ray mask.

To this end, the present invention provides an X-ray mask which comprises a membrane formed of a material which transmits X-rays, a mask pattern formed on the surface of the membrane, the mask pattern being made of an X-ray absorbing material, and a supporting frame formed of a material which is mechanically deformed by the application of an external signal, the supporting frame serving to support the membrane.

Further, the present invention provides an exposure method which comprises three steps. The first step is disposing an X-ray mask above a substrate in alignment therewith. The X-ray mask has a membrane formed of a material which transmits X-rays, a mask pattern formed on the surface of the membrane, the mask pattern being made of an X-ray absorbing material, and a supporting frame formed of a material which is mechanically deformed by the application of an external signal, the supporting frame supporting the membrane The second step is correcting the distortion caused in the mask pattern of the mask by the application of the external signal to the supporting frame of the mask. And the third step is irradiating the substrate with X-rays through the mask so as to transfer the mask pattern of the mask to the substrate.

BRIEF DESCRIPTION OF THE DRAWINGS

FIG. 8 is a block diagram of an apparatus which is used to carry out an exposure method employing the X-ray mask of FIG. 5;

DESCRIPTION OF THE PREFERRED EMBODIMENTS

An embodiment of the present invention will be described below with reference to the accompanying drawings.

Figure 5:
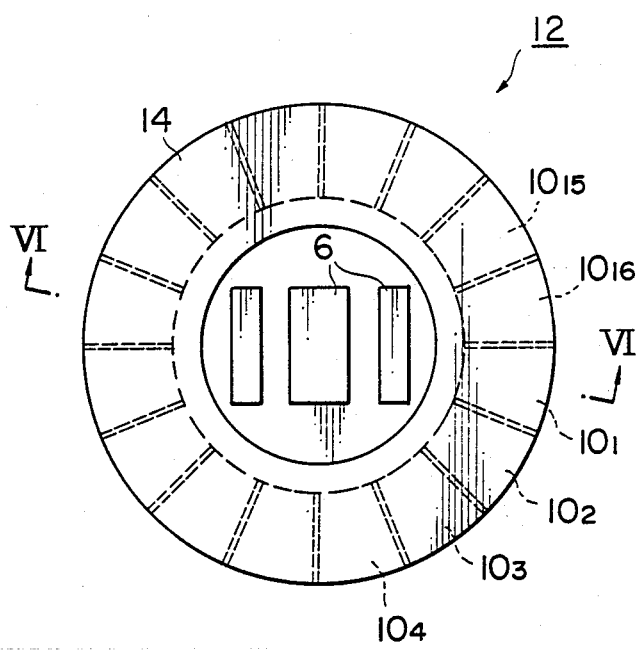
FIG. 5 is a plan view of an X-ray mask showing a first embodiment of the present invention.
Figure 6:
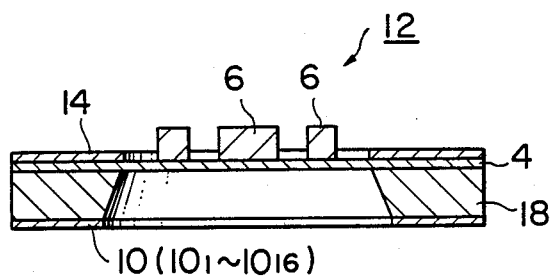
FIG. 6 is a section taken along the line VI—VI of FIG. 5.

Referring first to FIGS. 5 and 6, an X-ray mask 12 has a disk-shaped membrane 4 made of a material, such as silicon nitride, which is highly transparent to X-rays, as well as a mask pattern 6 formed on the central portion of one of the surfaces of the membrane 4. The mask pattern 6 is made of an X-ray absorbing material such as tungsten. A first electrode 14 made of Al or Au is formed in an annular form on the periphery of this surface of the membrane 4 on which the mask pattern 6 is formed so as to surround the mask pattern 6. To the other surface of the membrane 4 is bonded one side surface of a supporting frame 18 in the shape of an annular form on the periphery of the membrane 4 for mechanically supporting the membrane 4. This supporting frame 18 is made of an electrostriction material such as barium titanate or lead zirconate titanate. On the other side surface of the supporting frame 18 is formed a second annular electrode 10 made of Al or Au. The second electrode 10 is equally divided into 16 electrode portions $10_1$ to $10_{16}$ in the circumferential direction. The first electrode 14 is an electrode common to these electrode portions $10_1$ to $10_{16}$.

Such an X-ray mask structure 12 is prepared as follows: First, the disk-shaped solid supporting frame 18 having a thickness of 4 to 5 mm is formed of an electrostriction material, and the membrane 4 of silicon nitride is formed on one of the circular surfaces of this supporting frame 18 with a thickness of several $\mu$m by vacuum deposition, sputtering, or the CVD method. Thereafter, the first and second annular electrodes 14 and 10 of Al or Au are formed with a thickness of about 1 $\mu$m on the peripheries of the surface of the membrane 4 and the other circular surface of the supporting frame 18, respectively These electrodes 14 and 10 are formed, like the membrane 4, by vacuum deposition, sputtering, or the CVD method. Note that at this time the second electrode 10 is not yet divided and has a continuous annular form.

Next, the mask pattern 6 of tungsten having a desired pattern is formed on the central portion of the membrane 4 which is surrounded by the first electrode 14 by vacuum deposition, sputtering, or the CVD method. Subsequently, the central portion of the supporting frame 18 is etched with the second annular electrode 10 on the other surface of the supporting frame 18 serving as a mask, and the second electrode 10 is then divided into 16 electrode portions $10_1$ to $10_{16}$.

Figure 1:
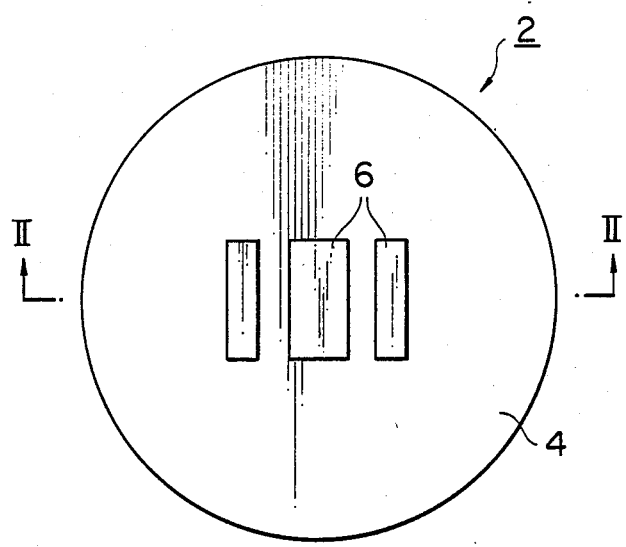
FIG. 1 is a plan view of a conventional X-ray mask.
Figure 2:
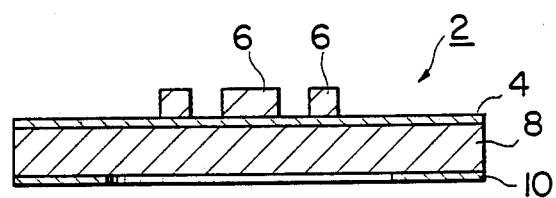
FIG. 2 is a section taken along the line II—II of FIG. 1, showing a state wherein a supporting frame has not yet been etched.
Figure 3:
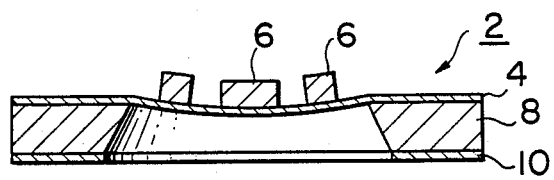
FIG. 3 is a section taken along the line II—II of FIG. 1, showing a state wherein the supporting frame has been etched.
Figure 4:
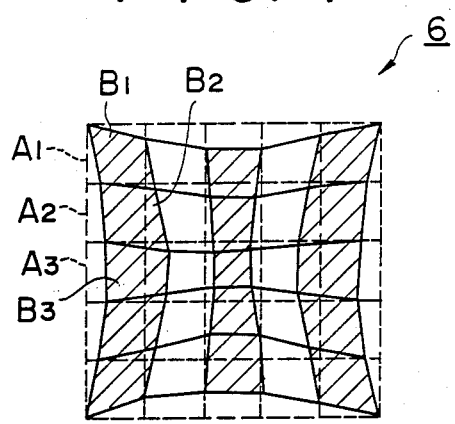
FIG. 4 is a plan view of a mask pattern which has been shifted from its correct position through the etching of the supporting frame.
Figure 7:
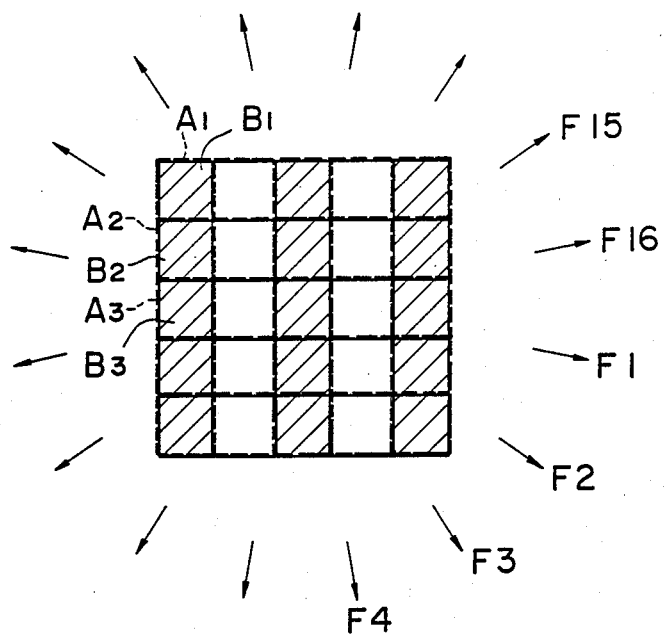
FIG. 7 is a plan view of a mask pattern which has been returned to its correct position.

Next, the operation of the thus-prepared mask 12 will be described. Assume that etching of the central portion of the supporting frame 18, which is performed with the annular second electrode 10 serving as the mask, caused a deformation of the membrane 4 and a shift of the mask pattern 6 from its correct position, as shown in FIG. 4. At this time, predetermined voltages $V_1$ to $V_{16}$ are respectively applied between the first electrode 14 and the individual electrode portions $10_1$ to $10_{16}$ of the second electrode 10 of the mask 12 as external signals so as to form electric fields between the first and second electrodes 14 and 10. Since the supporting frame 18 is made of an electrostriction material in an annular form, the application of the voltages causes radial forces shown by the arrows F1 to F16 in FIG. 7 to be exerted on the portions of the supporting frame 18 which respectively correspond to the individual electrode portions $10_1$ to $10_{16}$ of the second electrode 10. As a result, the supporting frame 18 is deformed in such a manner as to be enlarged in all directions, and the divided patterns $B_1$, $B_2$, $B_3$ . . . of the mask pattern 6 formed on the membrane 4 are thereby returned to their corrected positions $A_1$, $A_2$, $A_3$ . . . , as shown in FIG. 7.

Figure 9:
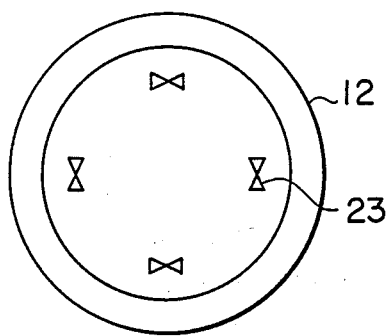
FIG. 9 is a plan view of an X-ray mask with aligning marks provided thereon.
Figure 10:
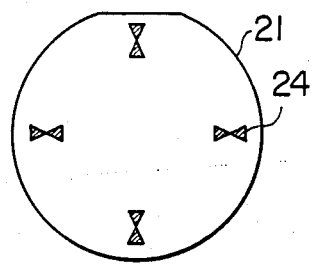
FIG. 10 is a plan view of a wafer with aligning marks thereon.

Next, an exposure method will be described with reference to FIG. 8 which is a block diagram of an exposure apparatus which employs the X-ray mask 12. A wafer 21 is held on a stage 20, and the X-ray mask 12 is disposed immediately above this wafer 21 at a position separated by several tens of $\mu$m. Further, an X-ray source 22 such as a plasma X-ray source or synchrotron orbital radiation source is disposed above the mask 12. The mask 12 has a plurality of alignment marks 23 shown in FIG. 9 formed thereon around the mask pattern 6. These aligning marks are formed by etching the membrane 4. The wafer 21 has a plurality of alignment marks 24 formed thereon at the positions corresponding to the alignment marks 23 formed on the mask 12, as shown in FIG. 10. The reflectivity of the alignment marks 24 of the wafer 21 is made different from that of the remaining portion of the surface of the wafer 21.

In FIG. 8, light sources 26 such as laser sources are respectively disposed above the alignment marks 23 of the mask 12 with half mirrors 25 therebetween. Beside each of the half mirrors 25 is disposed a photo detector 27, which is connected to a control device 28. Further, a voltage applying device 29 is connected between the first electrode 14 and the individual electrode portions $10_1$ to $10_{16}$ of the second electrode 10 of the mask 12 so as to apply voltages therebetween. Furthermore, the stage 20 on which the wafer 21 is held is connected to a stage driving device 30 for moving the stage 20 in the horizontal direction. The voltage applying device 29 and the stage driving device 30 are connected to the control device 28.

In operation, the alignment marks 24 of the wafer 21 are irradiated with parallel-rays by the individual light sources 26 through the corresponding half mirrors 25 and the alignment marks 23 of the mask 12. These rays of light are reflected by the alignment marks 24 of the wafer 21, pass through the alignment marks 23 of the mask 12, are reflected by the half mirrors 25, and are made incident on the corresponding photo detectors 27.

Figure 11:
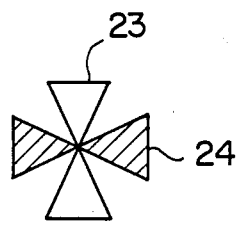
FIGS. 11 and 12 are plan views showing the states of the alignment marks which are provided when the X-ray mask and the wafer are aligned with each other.
Figure 12:
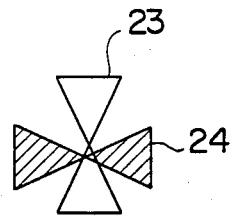

At this time, the intensity of the light detected by the photo detector 27 when the alignment mark 23 on the mask 12 is aligned with the alignment mark 24 on the wafer 21, as shown in FIG. 11, differs from that detected when the alignment marks 23 and 24 are not aligned with each other, as shown in FIG. 12, due to the difference in reflectivity between the alignment marks 24 on the wafer 21 and the remaining portion thereof. More specifically, if the alignment marks 24 of the wafer 21 have a reflectivity smaller than that of the remaining portion of the wafer surface, the intensity of the light detected by the photo detector 27 becomes a maximum when both of the marks 23 and 24 are aligned with each other, as shown in FIG. 11. Conversely, if the alignment marks 24 have a reflectivity larger than the remaining portion of the wafer surface, the detected intensity of the light becomes a minimum.

Upon receipt of the signals from the photo detectors 27, the control device 28 outputs a control signal to the stage driving device 30 so that the intensities of the light detected by the photo detectors 27 are maximized or minimized to make complete alignment of the marks 23 and 24. As a result, the wafer 21 is aligned with the mask 12 by the stage driving device 30. Thereafter, the distortion in the mask 12 is corrected while monitoring the intensities of the light detected by the photo detectors 27 in the same way as the above-described alignment between the mask 12 and the wafer 21. That is, upon receipt of the signals from the photo detectors 27, the control device 28 outputs a control signal to the voltage applying device 29 to apply voltages of appropriate magnitudes between the first and second electrodes 14 and 10 of the mask 12 so that the intensities of the light detected by the photo detectors 27 are maximized or minimized to correct the distortion caused in the mask 12.

After the alignment between the mask 12 and the wafer 21 and correction of the distortion in the mask 12 have been completed, the wafer 21 is irradiated with X-rays by the X-ray source 22 through the mask 12 so as to transfer the mask features to the wafer 21.

In this embodiment, the second electrode 10 bonded to the supporting frame 18 is divided. However, the first electrode 14 formed on the membrane 4 may be divided while the second electrode 10 may be formed as a common electrode.

Further, the number of divided electrode portions is not limited to 16 but may be set to any desired number. Note that the larger the number, the higher the distortion correction and pattern transfer accuracies become.

Figure 13:
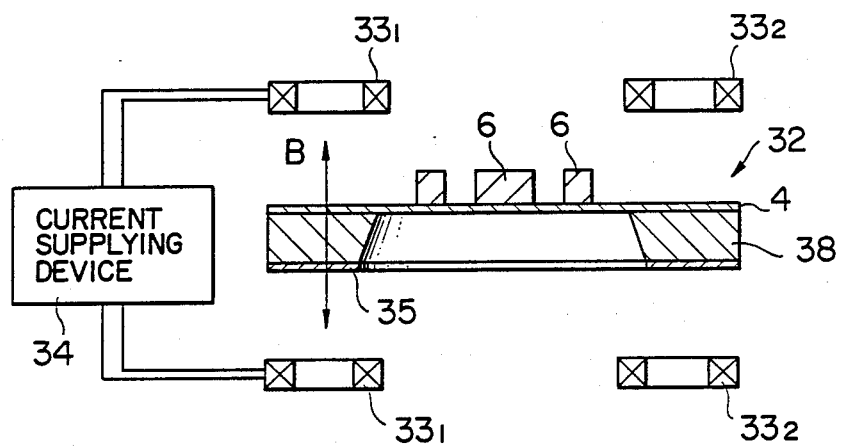
FIG. 13 is a cross-sectional view of a mask showing another embodiment of the present invention.

FIG. 13 is a cross-sectional view of an X-ray mask 32, showing another embodiment of the present invention. This mask 32 has an annular supporting frame 38 made of a magnetostriction material such as alfer alloy or nickel-copper type ferrite. The membrane 4 is formed on this supporting frame 38, and the mask pattern 6 is in turn formed on this membrane 4.

As shown in FIG. 13, a plurality of electromagnetic coil pairs $33_1$, $33_2$... are equiangularly disposed in the circumferential direction of the supporting frame 38 in such a manner that the supporting frame 38 is interposed between the components of each electromagnetic coil pair disposed on the two sides of the supporting frame 38. Also, these pairs are connected to a current supplying device 34 for supplying current to individual electromagnetic coil pairs $33_1$, $33_2$... The supply of current to each electromagnetic coil pair $33_1$, $33_2$... forms a magnetic field B in which lines of magnetic force pass through the corresponding portion of the supporting frame 38 interposed between the two components of the electromagnetic coil pair, whereby the supporting frame 38 made of a magnetostriction material is magnetically deformed and the distortion caused in the mask 32 is corrected by controlling the strength of this magnetic field.

Since the supporting frame 38 is formed of a magnetostriction material as in the case of this embodiment, provision of the first and second electrodes 14 and 10 employed in the first embodiment is eliminated. It is to be noted, however, that an annular etching mask 35 is provided on the lower surface of the supporting frame 38 shown in FIG. 13. The mask 35 acts as a mask for the supporting frame when the supporting frame 38 is etched.

As will be understood from the foregoing description, in the X-ray mask of this invention, since the supporting frame is formed of an electrostriction or magnetostriction material which can be deformed by the application of an external signal, there will be no possibility of electrostriction elements in a mask being bonded to the supporting frame, as in the case of the conventional X-ray mask, or of the electrostriction elements being peeled off from the supporting frame. This increases the reliability of the mechanical structure of the X-ray mask, and substantially reduces troublesomeness or inefficiency involved in the manufacture of the mask.

What is claimed is:
1. An X-ray mask comprising:
   a membrane formed of a material which transmits X-rays;
   a mask pattern formed on said membrane, said mask pattern being made of an X-ray absorbing material; and
   a supporting frame formed of a material which is mechanically deformed in response to the application of an external signal, said supporting frame supporting said membrane.
2. An X-ray mask according to claim 1, wherein said supporting frame is annular and includes a central opening.
3. An X-ray mask according to claim 2, wherein said mask pattern is disposed on said membrane opposite said opening.
4. An X-ray mask according to claim 1, wherein said membrane is bonded to said supporting frame.
5. An X-ray mask according to claim 1, wherein said supporting frame is mechanically deformed in response to an electric field.
6. An X-ray mask according to claim 1, wherein said supporting frame is formed of an electrostriction material.
7. An X-ray mask according to claim 6, further including an electric field application means for applying an electric field to said supporting frame.
8. An X-ray mask according to claim 7, wherein said electric field application means includes first electrode means formed on said membrane, and second electrode means formed on said supporting frame, for forming an electric field therebetween.
9. An X-ray mask according to claim 8, wherein said first and second electrode means are annular and aligned with said supporting frame.
10. An X-ray mask according to claim 9, wherein said first electrode means includes a plurality of electrodes radially separated from each other, said second electrode means being an electrode common to said first electrode means.
11. An X-ray mask according to claim 10, including a power source device for selectively applying voltages between said individual electrodes of said first electrode means and said second electrode means.

12. An X-ray mask according to claim 9, wherein said second electrode means includes a plurality of electrodes radially separated from each other, said first electrode means being an electrode common to said second electrode means.

13. An X-ray mask according to claim 12, including a power source device for selectively applying voltages between said individual electrodes of said second electrode means and said first electrode means.

14. An X-ray mask according to claim 1, wherein said supporting frame is mechanically deformed in response to a magnetic field.

15. An X-ray mask according to claim 1, wherein said supporting frame is made of a magnetostriction material.

16. An X-ray mask according to claim 15, further including a magnetic field applying means for applying a magnetic field to said supporting frame.

17. An X-ray mask according to claim 16, wherein said magnetic field applying means includes a plurality of electromagnetic coil pairs with said supporting frame interposed between said pairs.

18. An exposure method comprising the steps of: disposing an X-ray mask above a substrate in alignment therewith, said X-ray mask having a membrane formed of a material which transmits X-rays, a mask pattern formed on the surface of said membrane, said mask pattern being made of an X-ray absorbing material, and a supporting frame formed of a material which is mechanically deformed in response to the application of an external signal, said supporting frame supporting said membrane;

correcting distortion in said mask pattern of an mask by the application of said external signal to said supporting frame of said mask; and irradiating said substrate with X-rays through said mask so as to transfer said mask pattern of said mask to said substrate.

19. An exposure method according to claim 18, further including steps of:

irradiating said substrate with rays of light through said mask so as to irradiate a first alignment mark provided on said mask and a second alignment mark provided on said substrate; and measuring the intensity of the light reflected by said substrate.

20. An exposure method according to claim 19, including correcting distortion in said mask pattern of said mask by applying an external signal to said supporting frame of said mask in response to the intensity of reflected light.

21. An exposure method according to claim 19, including aligning said mask and said substrate by moving said substrate in response to the intensity of reflected light.

* * * * *